(12) United States Patent
Nakamura

(10) Patent No.: US 12,106,966 B2
(45) Date of Patent: Oct. 1, 2024

(54) PROCESSING METHOD OF WAFER

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 430 days.

(21) Appl. No.: 17/455,993

(22) Filed: Nov. 22, 2021

(65) Prior Publication Data

US 2022/0172952 A1  Jun. 2, 2022

(30) Foreign Application Priority Data

Nov. 30, 2020  (JP) .................................. 2020-198411

(51) Int. Cl.
*H01L 21/304* (2006.01)
*H01L 21/02* (2006.01)

(52) U.S. Cl.
CPC ...... *H01L 21/304* (2013.01); *H01L 21/02021* (2013.01)

(58) Field of Classification Search
CPC .......................... H01L 21/304; H01L 21/0201
USPC ............................................................. 451/57
See application file for complete search history.

(56) References Cited

U.S. PATENT DOCUMENTS

| 2020/0027773 A1 | 1/2020 | Lin | |
| 2020/0135566 A1* | 4/2020 | Aketa | ................. H01L 21/7813 |
| 2020/0168451 A1 | 5/2020 | Lu et al. | |
| 2021/0053148 A1* | 2/2021 | Rieske | .............. H01L 21/02002 |
| 2021/0202317 A1* | 7/2021 | Wang | ....................... H01L 21/78 |
| 2022/0040799 A1* | 2/2022 | Mori | ...................... H01L 21/304 |
| 2022/0181157 A1* | 6/2022 | Tanoue | ................. H01L 21/268 |
| 2022/0250191 A1* | 8/2022 | Tanoue | ................ B23K 26/062 |
| 2022/0336221 A1* | 10/2022 | Lee | ..................... B23K 26/0622 |
| 2022/0406602 A1* | 12/2022 | Tanoue | .................. B23K 26/53 |

FOREIGN PATENT DOCUMENTS

JP     2000173961 A     6/2000

OTHER PUBLICATIONS

Search report issued in counterpart Singapore patent application No. 102021129462Y, dated May 15, 2023.

* cited by examiner

*Primary Examiner* — Joel D Crandall
*Assistant Examiner* — Jason Khalil Hawkins
(74) *Attorney, Agent, or Firm* — Greer, Burns & Crain, Ltd.

(57) ABSTRACT

A processing method of a wafer includes trimming the wafer along its outer peripheral edge while causing a cutting blade to cut from a front surface into a chamfered portion to a depth greater than a finish thickness, so that an annular stepped portion is formed in an outer peripheral surplus region. A protective member is bonded to a side of the front surface of the wafer, and the wafer is ground from its back surface to thin the wafer to a finish thickness. Between trimming and grinding, a laser beam is applied to the stepped portion, so that annular modified layers which are to be fractured under a pressing force to be applied by the grinding are formed in the stepped portion, whereby the fractured fragments of the stepped portion are subdivided.

23 Claims, 5 Drawing Sheets

PROCESSING METHOD OF WAFER

BACKGROUND OF THE INVENTION

Field of the Invention

The present invention relates to a processing method of a wafer.

Description of the Related Art

Semiconductor device chips are manufactured by thinning a wafer in which a plurality of devices is formed in a front surface of a substrate of silicon or the like and dividing the same into individual chips. To avoid damage during transfer, the wafer has a chamfered round shape at its outer peripheral edge. If, however, the wafer is ground from a side of its back surface where no devices are formed, to thin the same to an extremely small thickness of 50 µm or smaller, the outer peripheral edge of the round shape is changed into what is generally called a knife edge and remains as a sharp edge, so that the outer peripheral edge becomes prone to chipping.

Hence, what are generally called edge trimming techniques have been developed to cut off a rounded edge of a wafer along its outer peripheral edge on a side of its device-bearing surface (see, for example, JP 2000-173961A). These edge trimming techniques can suppress the occurrence of edge chipping even if wafers are ground thin.

SUMMARY OF THE INVENTION

According to the edge trimming technique disclosed in JP 2000-173961A, however, a stepped portion remains in an edge and chips off during the grinding, so that off-cuts occur as large annular pieces. These off-cuts build in a drain case or the like of a cutting machine, and a problem that needs periodical cleaning now remains unsolved.

The present invention therefore has as an object thereof the provision of a processing method of a wafer (hereinafter may also be referred to as a "wafer processing method"), which can reduce the size of off-cuts that occur when an edge-trimmed wafer is ground.

In accordance with an aspect of the present invention, there is provided a processing method of a wafer which has on a front surface thereof a device region with a plurality of devices formed therein and an outer peripheral surplus region surrounding the device region and which has a chamfered portion at an outer periphery thereof, by grinding the wafer at a back surface thereof to thin the wafer to a finish thickness. The processing method includes a trimming step of cutting the wafer along an outer peripheral edge thereof while causing a cutting blade to cut from the front surface of the wafer into the chamfered portion to a depth greater than the finish thickness, so that an annular stepped portion is formed in the outer peripheral surplus region, a protective member bonding step of, after performing the trimming step, bonding a protective member to a side of the front surface of the wafer, a laser processing step of, after performing the protective member bonding step, applying, to the annular stepped portion, a laser beam of a wavelength that has transmissivity for the wafer, and a griding step of, after performing the laser processing step, of grinding the wafer from the back surface thereof to thin the wafer to the finish thickness. In the laser processing step, fracture starting points from which the wafer is to be fractured under an external force to be applied by the grinding are formed in the stepped portion, so that fragments of the stepped portion, the fragments being to occur in the grinding step, are to be subdivided.

Preferably, the fracture starting points formed in the laser processing step are a plurality of annular modified layers formed along the outer peripheral edge of the wafer, and the annular modified layers are formed concentrically with each other.

Preferably, the annular modified layers formed concentrically with each other along the outer peripheral edge of the wafer have a greater length in a thickness direction of the wafer as the annular modified layers are each located closer to the outer peripheral edge.

The wafer processing method of the present invention brings about an advantageous effect that the off-cuts which occur when an edge-trimmed wafer is ground can be reduced in size.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will hereinafter be made in detail about an embodiment of the present invention. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Furthermore, various omissions, replacements, and modifications of configurations can be made without departing from the spirit of the present invention.

Figure 1:
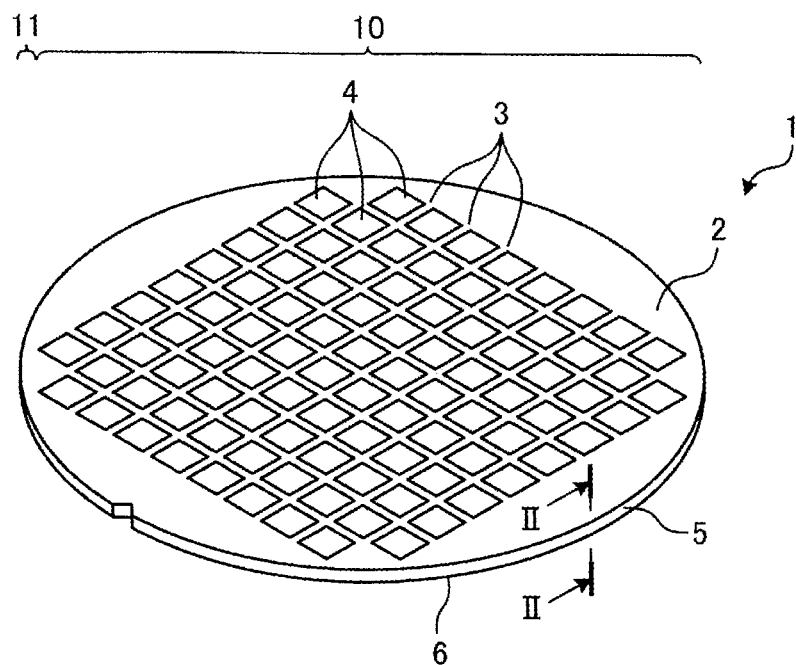
FIG. 1 is a perspective view depicting an example of a wafer as an object of processing by a wafer processing method according to an embodiment of the present invention.
Figure 2:
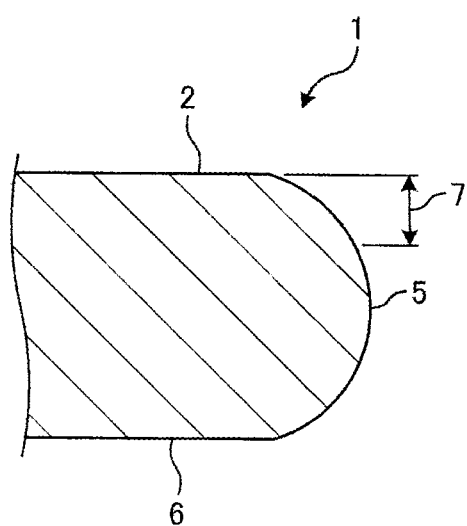
FIG. 2 is a cross-sectional view of the wafer taken along line II-II in FIG. 1.
Figure 3:
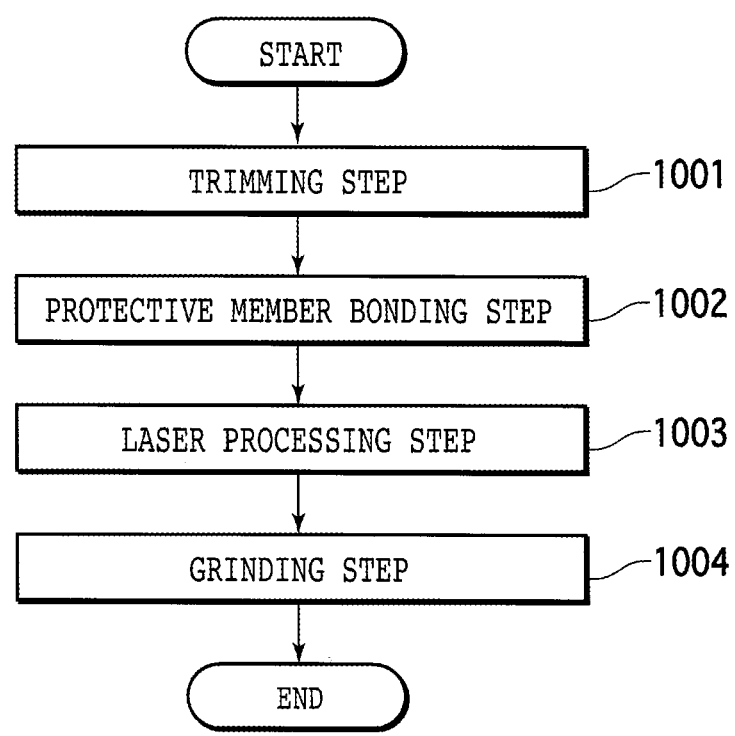
FIG. 3 is a flow chart illustrating a flow of the wafer processing method according to the embodiment.

The wafer processing method according to the embodiment of the present invention will be described based on the drawings. FIG. 1 is a perspective view depicting an example of a wafer (may hereinafter be referred to as a "wafer 1") as an object of processing by the wafer processing method according to this embodiment. FIG. 2 is a cross-sectional view of the wafer 1 taken along line II-II in FIG. 1. FIG. 3 is a flow chart illustrating a flow of the wafer processing method according to this embodiment.

The wafer 1 is a disc-shaped semiconductor wafer, an optical device wafer, or the like, which is made from silicon, gallium arsenide, silicon carbide (SiC), sapphire, or the like as a base material. The wafer 1 has, on a front surface 2 thereof, a device region 10 and an outer peripheral surplus region 11. In the device region 10, a plurality of devices 4 is formed in regions defined in a grid pattern by a plurality of scribe lines (hereinafter referred to as "the streets") 3. The devices 4 are, for example, integrated circuits such as integrated circuits (ICs) or large scale integration (LSI) circuits, or image sensors such as charge coupled devices (CCDs) or complementary metal oxide semiconductors (CMOSs).

The outer peripheral surplus region 11 surrounds the device region 10 over an entire periphery thereof, and no devices 4 are formed there.

As depicted in FIG. 2, the wafer 1 has a chamfered portion 5 at an outer periphery thereof. The chamfered portion 5 is formed extending from the front surface 2 to a back surface 6 and is formed in a circular arc shape as viewed in cross-section such that the chamfered portion 5 is located on an outermost peripheral side at a center thereof in a thickness direction of the wafer 1.

The wafer processing method according to this embodiment grinds the wafer 1 at the back surface 6 thereof to thin the same to a finish thickness 7 (see FIG. 2). As illustrated in FIG. 3, the wafer processing method according to this embodiment includes a trimming step 1001, a protective member bonding step 1002, a laser processing step 1003, and a grinding step 1004.

(Trimming Step)

Figure 4:
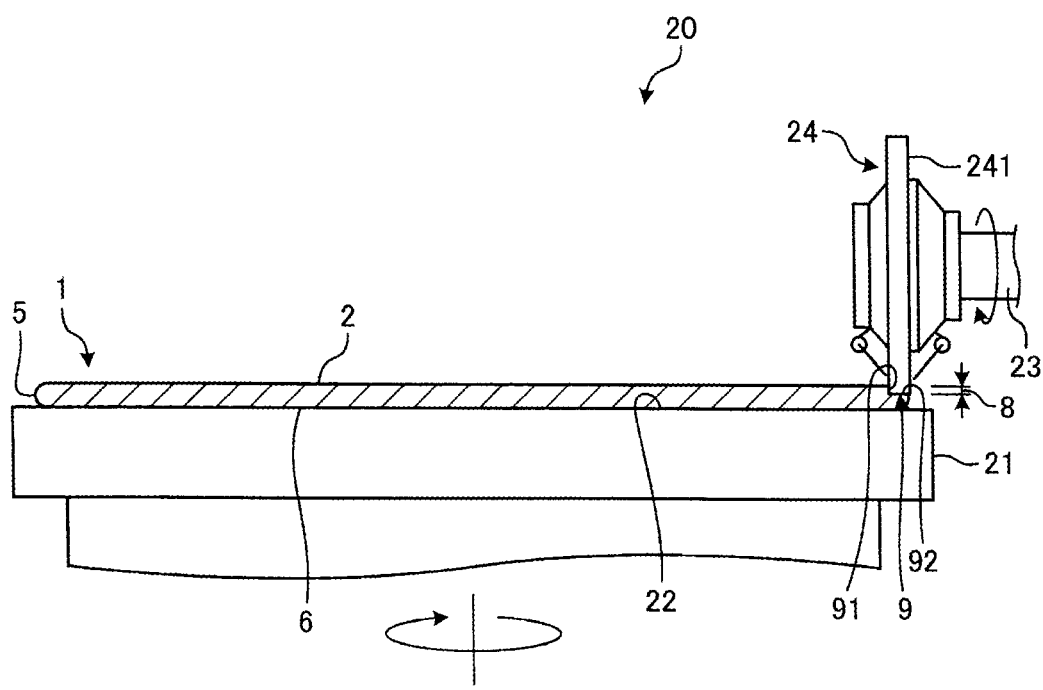
FIG. 4 is a side view depicting partly in section a trimming step of the wafer processing method illustrated in FIG. 3.

FIG. 4 is a side view depicting partly in section the trimming step 1001 of the wafer processing method illustrated in FIG. 3. In the trimming step 1001, the wafer 1 is cut along an outer peripheral edge thereof while a cutting blade 24 is caused to cut from the front surface 2 of the wafer 1 into the chamfered portion 5 to a depth 8 greater than the finish thickness 7 such that an annular stepped portion 9 is formed in the outer peripheral surplus region 11.

In the trimming step 1001, a cutting machine 20 holds the wafer 1 on a side of the back surface 6 thereof under suction on a holding surface 22 of a chuck table 21. The cutting machine 20 rotates the cutting blade 24 about an axis of rotation thereof by a spindle 23, and places a lower end of a cutting edge 241 of the cutting blade 24 side by side with the chamfered portion 5 as the outer peripheral edge of the wafer 1 along a processing feed direction of the chuck table 21, and also at a position lower by a distance greater than the finish thickness 7 from the front surface 2 of the wafer 1. The above-mentioned distance is the same as the depth 8.

In the trimming step 1001, the cutting machine 20, as depicted in FIG. 4, carries out processing feed of the chuck table 21 in a direction toward the cutting blade 24, thereby causing the cutting blade 24 to cut into the chamfered portion 5 of the wafer 1, and also rotates the chuck table 21 about an axis of rotation thereof. The cutting machine 20 causes the cutting blade 24 to cut from a side of the front surface 2 into the chamfered portion 5 of the wafer 1 to the depth 8 greater than the finish thickness 7, whereby the chamfered portion 5 is removed by the depth 8 from the side of the front surface 2 to form the stepped portion 9. In this embodiment, the stepped portion 9 is defined by a vertical surface 91 and a horizontal surface 92. The vertical surface 91 is formed on a radially inner side of the outer peripheral edge of the wafer 1 and extends from the front surface 2 in a direction orthogonal to the front surface 2. The horizontal surface 92 is formed in parallel with the front surface 2 from an end of the vertical surface 91, the end being located on the side of the back surface 6, toward the outer peripheral edge of the wafer 1. The vertical surface 91 and the horizontal surface 92 are both formed over an entire periphery of the wafer 1, and the stepped portion 9 is formed in the outer peripheral edge of the wafer 1 over an entire periphery thereof and has an annular shape.

In the trimming step 1001 of this embodiment, the cutting machine 20, as described above, removes the chamfered portion 5 on the side of the front surface 2 by moving the cutting blade 24, with the lower end of the cutting edge 241 being positioned lower than the front surface 2, in a horizontal direction relative to the wafer 1, to cause the cutting blade 24 to cut into the wafer 1, and also by rotating the wafer 1 by the chuck table 21 about an axis of rotation of the chuck table 21. In the present invention, however, the cutting machine 20 may also remove the chamfered portion 5 from the side of the front surface 2 in the trimming step 1001 by what is generally called chopper cutting, that is, by lowering the lower end of the cutting edge 241 of the cutting blade 24, the lower end being positioned above the chamfered portion 5 of the wafer 1, to the depth 8 greater than the finish thickness 7 to cause the cutting edge 241 to cut into the chamfered portion 5 of the wafer 1, and also by rotating the wafer 1 by the chuck table 21 about the axis of rotation of the chuck table 21. The wafer processing method removes the chamfered portion 5 from the side of the front surface 2 by the depth 8 greater than the finish thickness 7 over the entire periphery of the wafer 1 to form the stepped portion 9, and then proceeds to the protective member bonding step 1002.

Protective Member Bonding Step

Figure 5:
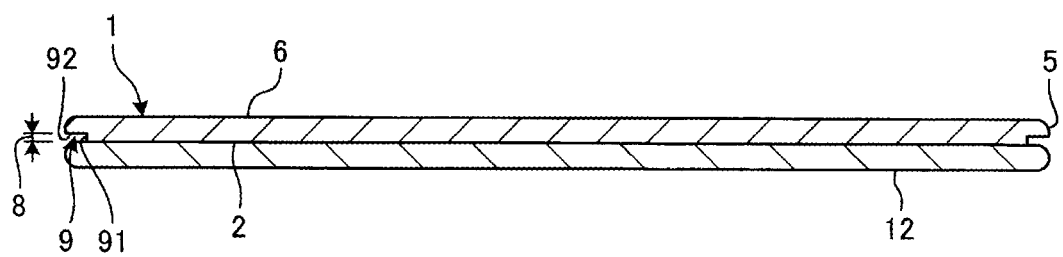
FIG. 5 is a cross-sectional view of the wafer after a protective member bonding step of the wafer processing method illustrated in FIG. 3.

FIG. 5 is a cross-sectional view of the wafer 1 after the protective member bonding step 1002 of the wafer processing method illustrated in FIG. 3. In the protective member bonding step 1002, a protective member 12 is bonded to the side of the front surface 2 of the wafer 1 after the trimming step 1001 is performed. In this embodiment, the protective member 12 is a substrate which is formed in a disc shape having an outer diameter equal to that of the wafer 1 and which is made from a hard resin or metal. In this invention, however, the protective member 12 may also be a protective tape which includes a base material layer formed of a resin having non-adhesiveness and flexibility and a glue layer laminated on the base material layer and made of a resin having adhesiveness and flexibility. When the protective member 12 has been bonded to the side of the front surface 2 of the wafer 1 in the protective member bonding step 1002 of this embodiment as depicted in FIG. 5, the wafer processing method proceeds to the laser processing step 1003.

(Laser Processing Step)

Figure 6:
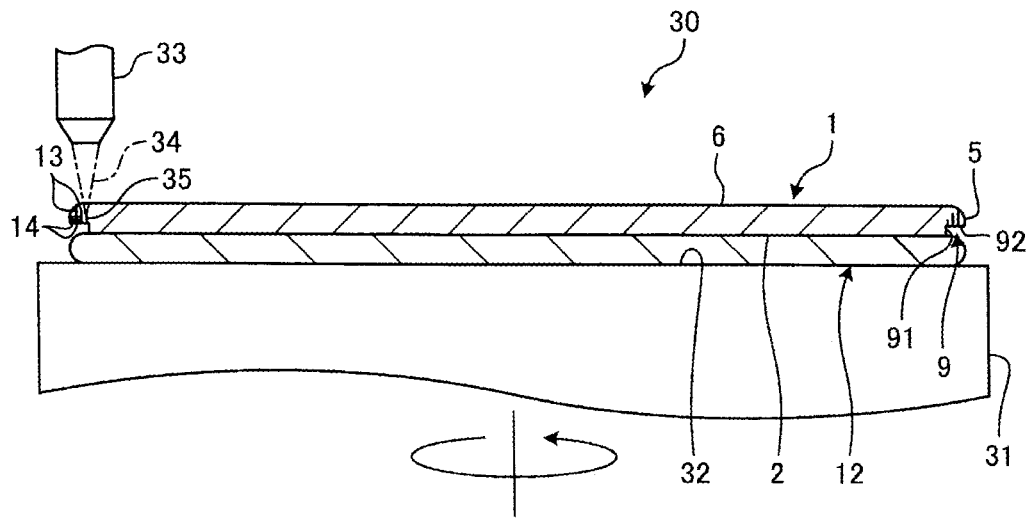
FIG. 6 is a side view depicting partly in section a laser processing step of the wafer processing method illustrated in FIG. 3.
Figure 7:
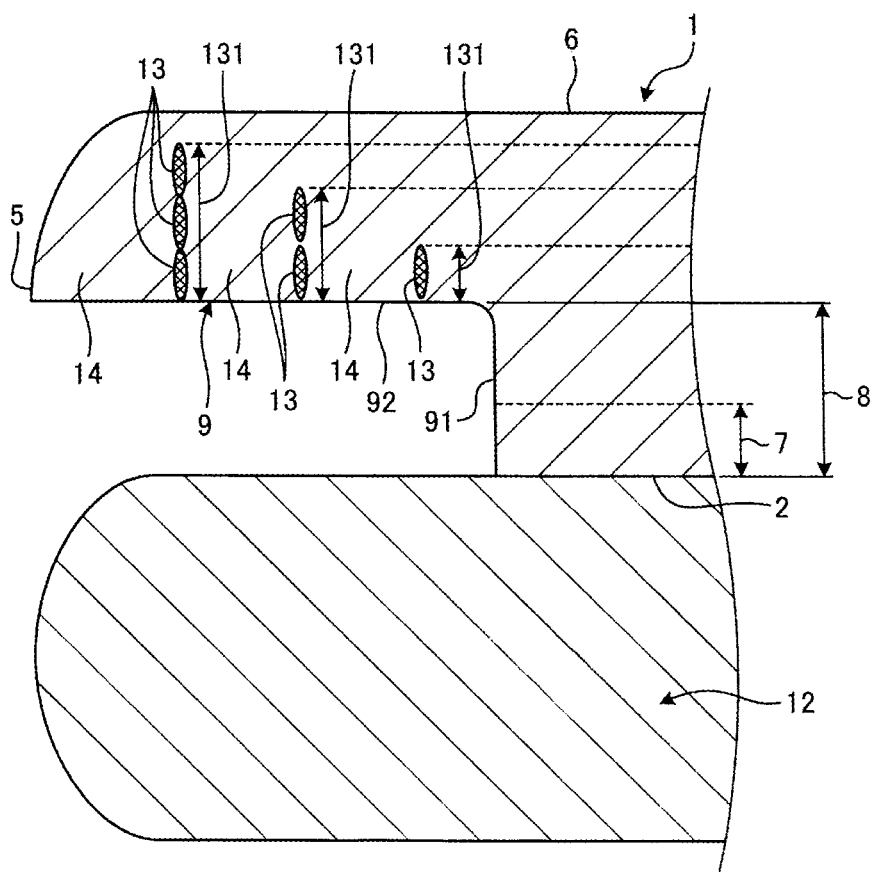
FIG. 7 is a fragmentary cross-sectional view of the wafer after the laser processing step of the wafer processing method illustrated in FIG. 3.

FIG. 6 is a side view depicting partly in section the laser processing step 1003 of the wafer processing method illustrated in FIG. 3. FIG. 7 is a fragmentary cross-sectional view of the wafer 1 after the laser processing step 1003 of the wafer processing method illustrated in FIG. 3. In the laser processing step 1003, after the trimming step 1001 is performed and before the grinding step 1004 is performed, a laser beam 34 of a wavelength which has transmissivity for the wafer 1 is applied to the annular stepped portion 9 to form, in the stepped portion 9, annular modified layers 13 as fracture starting points from which the wafer 1 is to be fractured under a pressing force to be applied as an external force during the grinding in the grinding step 1004, so that off-cuts 14 (see FIG. 7) as fragments of the stepped portion 9, the fragments being to occur in the grinding step 1004, are to be subdivided.

The annular modified layers 13 are formed concentrically with each other along the outer peripheral edge of the wafer 1 as viewed in plan. The annular modified layers 13 mean regions changed into a different state of density, refractive index, mechanical strength, or other physical properties from those of surroundings. The annular modified layers 13 are each a region which is, for example, a fusion processed region, a cracked region, a dielectric breakdown region, a refractive index change region, a region where two or more of these regions exist mixed together, or the like. The annular modified layers 13 are lower in mechanical strength or the like than the remaining portions of the wafer 1. In this embodiment, the fracture starting points formed in the laser processing step 1003 are the annular modified layers 13 formed along the outer peripheral edge of the wafer 1 as appreciated from the foregoing.

In the laser processing step 1003 of this embodiment, after the protective member bonding step 1002 is performed, a laser processing machine 30 holds the wafer 1 on the side of the front surface 2 thereof under suction on a holding surface 32 of a chuck table 31 via the protective member 12. The laser processing machine 30 then position, above the stepped portion 9, a laser beam application unit 33 that applies the laser beam 34. Subsequently, the laser processing machine 30 sets a focal point 35 inside the stepped portion 9, and as depicted in FIG. 6, rotates the chuck table 31 about the axis of rotation thereof while applying the laser beam 34 of the wavelength which has transmissivity for the wafer 1, from the laser beam application unit 33 to the stepped portion 9, so that the annular modified layers 13 are formed inside the stepped portion 9 over the entire periphery of the wafer 1, in other words, the chamfered portion 5.

In the laser processing step 1003, the annular modified layers 13 are formed concentrically with each other in the stepped portion 9, specifically, at positions in the stepped portion 9, the positions being coaxial with the wafer 1, by the laser processing machine 30 as depicted in FIG. 7. In the laser processing step 1003 of this embodiment, the laser processing machine 30 forms three annular modified layers 13 concentrically with each other in the stepped portion 9.

The three annular modified layers 13 formed concentrically with each other by the laser processing machine 30 have a greater length 131 in the thickness direction of the wafer 1 as they are each located closer to the outer peripheral edge of the wafer 1. The three annular modified layers 13 may hereinafter be referred to as "the radially outermost annular modified layer 13," "the radially central annular modified layer 13," and "the radially innermost annular modified layer 13," respectively. Upon formation of the radially outermost annular modified layer 13, the laser processing machine 30 sets the focal point 35 at a plurality of (in the embodiment, three) different heights in the thickness direction, and at each height, sequentially rotates the wafer 1 at least one turn about the axis of rotation of the chuck table 31 while the laser beam 34 is applied. In the laser processing step 1003 of this embodiment, the laser processing machine 30 forms the radially outermost annular modified layer 13 in three layers in the thickness direction inside the stepped portion 9 as depicted in FIG. 7.

Further, upon formation of the radially central annular modified layer 13, the laser processing machine 30 sets the focal point 35 at a plurality (smaller than that upon formation of the radially outermost annular modified layers 13) of (in the embodiment, two) different heights in the thickness direction, and at each height, sequentially rotates the wafer 1 at least one turn about the axis of rotation of the chuck table 31 while the laser beam 34 is applied. In the laser processing step 1003 of this embodiment, the laser processing machine 30 forms the radially central annular modified layer 13 in two layers in the thickness direction inside the stepped portion 9 as depicted in FIG. 7.

Further, upon formation of the radially innermost annular modified layer 13, the laser processing machine 30 sets the focal point 35 at a smaller number (than that upon formation of the radially central annular modified layers 13) of (in the embodiment, one) height or heights in the thickness direction, and at the height so set, rotates the wafer 1 at least one turn about the axis of rotation of the chuck table 31 while the laser beam 34 is applied. In the laser processing step 1003 of this embodiment, the laser processing machine 30 forms the radially innermost annular modified layer 13 as a single layer in the thickness direction inside the stepped portion 9 as depicted in FIG. 7.

Therefore, the length 131 of the radially outermost annular modified layer 13 is greater in the thickness direction of the wafer 1 than the length 131 of the radially central annular modified layer 13, and the length 131 of the radially central annular modified layer 13 is greater in the thickness direction of the wafer 1 than the length 131 of the radially innermost annular modified layer 13.

In the laser processing step 1003 of this embodiment, the laser processing machine 30 also forms the three annular modified layers 13 closer to the back surface 6 as they are each located closer to the outer peripheral edge of the wafer 1. In other words, the laser processing machine 30 forms the radially outermost annular modified layer 13 closer to the back surface 6 than the radially central annular modified layer 13, and also forms the radially central annular modified layer 13 closer to the back surface 6 than the radially innermost annular modified layer 13. When the three annular modified layers 13 have been formed concentrically with each other inside the stepped portion 9 of the wafer 1 in the laser processing step 1003, the wafer processing method proceeds to the grinding step 1004.

Grinding Step

Figure 8:
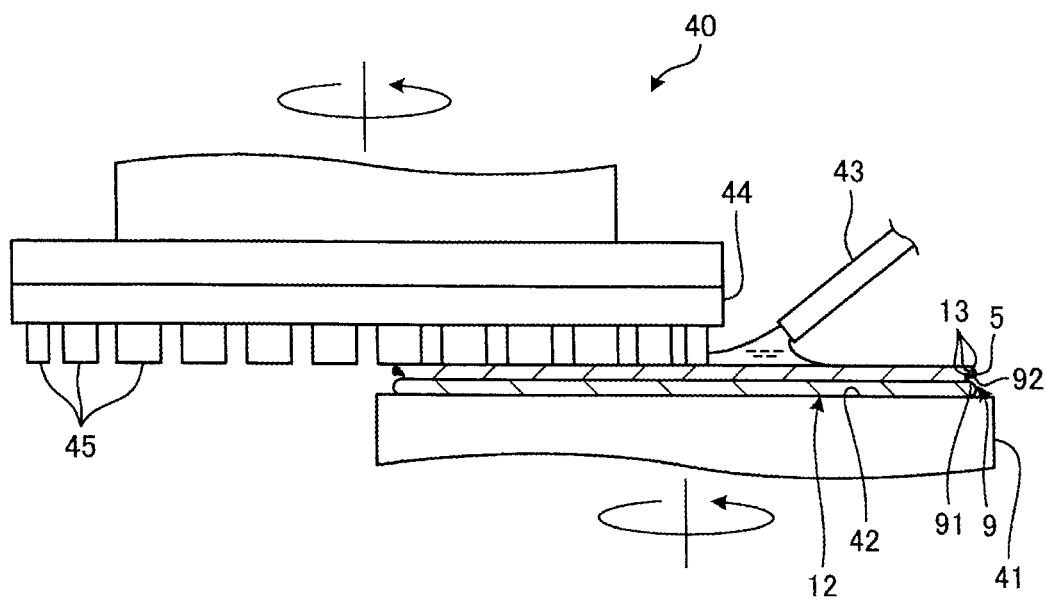
FIG. 8 is a side view depicting partly in section a grinding step of the wafer processing method illustrated in FIG. 3.
Figure 9:
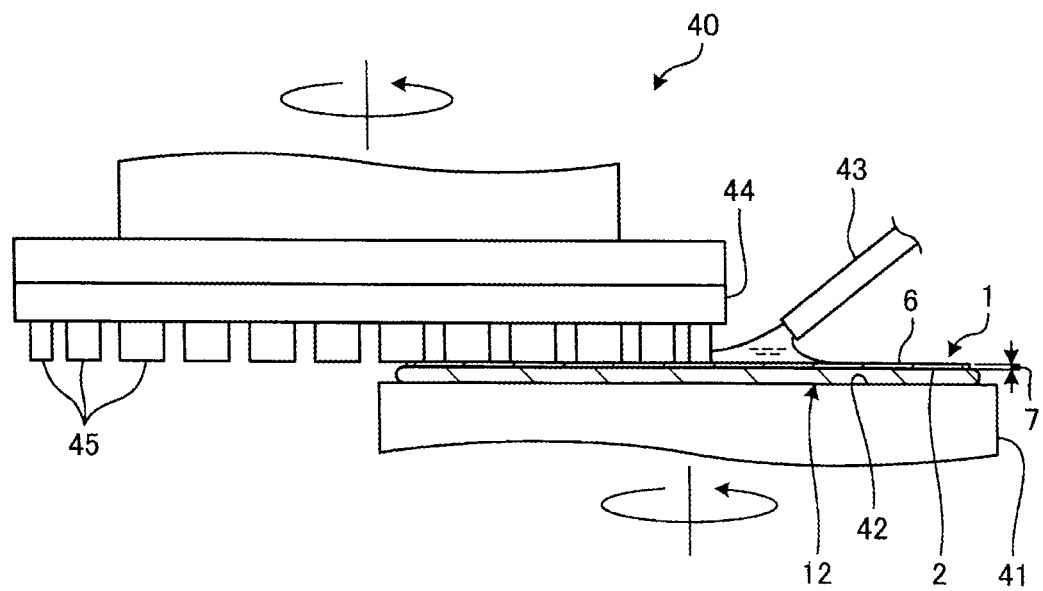
FIG. 9 is a side view depicting partly in section a state shortly before completion of the grinding step of the wafer processing method illustrated in FIG. 3.

FIG. 8 is a side view depicting partly in section the grinding step 1004 of the wafer processing method illustrated in FIG. 3. FIG. 9 is a side view depicting partly in section a state shortly before completion of the grinding step 1004 of the wafer processing method illustrated in FIG. 3. In the grinding step 1004, after the protective member bonding step 1002 is performed and also after the laser processing step 1003 is performed, the wafer 1 is ground at the back surface 6 thereof to thin the same to the finish thickness 7.

In the grinding step 1004, a grinding machine 40 first holds the wafer 1 on the side of the front surface 2 thereof under suction on a holding surface 42 of a chuck table 41 via the protective member 12. As depicted in FIG. 8, the grinding machine 40 then rotates a grinding wheel 44 about an axis of rotation thereof while rotating the chuck table 41 about an axis of rotation thereof with grinding water being supplied from a supply nozzle 43 to the back surface 6 of the wafer 1, and brings grinding stones 45 into contact with the back surface 6 of the wafer 1 and then presses the wafer 1 toward the chuck table 41 by the grinding stones 45, to carry out grinding processing of the back surface 6 of the wafer 1. As depicted in FIG. 9, the grinding machine 40 continues the grinding processing of the wafer 1 until the wafer 1 is thinned to the finish thickness 7.

As the annular modified layers 13 have been formed inside the stepped portion 9, the grinding of the back surface 6 of the wafer 1 by the grinding machine 40 in the grinding step 1004 causes fracture of the wafer 1 from the annular modified layers 13 as fracture starting points under a pressing force applied as an external force from the grinding stones 45 during the grinding. In addition, as the radially outermost annular modified layers 13 is formed closer to the back surface 6 than the radially central and radially innermost annular modified layers 13, the grinding of the back surface 6 of the wafer 1 by the grinding machine 40 in the grinding step 1004 causes separation of the stepped portion 9 as off-cuts 14 sequentially from an outer peripheral side thereof which is close to the radially outermost annular modified layer 13 and which has been reached by the grinding stones 45.

In the grinding step 1004 of this embodiment, the stepped portion 9 is first separated as off-cuts 14 from the wafer 1 on an outer peripheral side of the radially outermost annular modified layer 13, is next separated as off-cuts 14 from the wafer 1 on an outer peripheral side of the radially central annular modified layer 13, and is finally separated as off-cuts 14 from the wafer 1 on an outer peripheral side of the radially innermost annular modified layer 13. Using the three annular modified layers 13 as fracture starting points in the grinding step 1004 of this embodiment, the stepped portion 9 of the wafer 1 is separated as a plurality of off-cuts 14 from the wafer 1. In the wafer processing method according to this embodiment, the off-cuts 14 which are separated from the wafer 1 in the grinding step 1004 have sizes smaller than those of conventional fragments which occur through separation of the whole stepped portion 9 from the wafer 1 by conventional processing methods. The wafer processing method ends when the wafer 1 has been thinned to the finish thickness 7.

In the above-described wafer processing method according to this embodiment, the annular modified layers 13 are formed inside the stepped portion 9 in the laser processing step 1003, and therefore the stepped portion 9 is fractured to small sizes under a pressing force applied during the grinding in the grinding step 1004, thereby bringing about an advantageous effect that the occurring off-cuts 14 can be made smaller.

As a result, the wafer processing method according to this embodiment brings about an advantageous effect that when griding the edge-trimmed wafer 1, the occurring off-cuts 14 can be reduced in size.

As the annular modified layers 13 are formed concentrically with each other and have a greater length 131 in the thickness direction of the wafer 1 as the annular modified layers 13 are each located closer to the outer peripheral edge of the wafer 1, the wafer processing method according to this embodiment also brings about another advantageous effect that as the grinding proceeds, the off-cuts 14 are separated from the wafer 1 sequentially from the outer peripheral side thereof, and smooth fracture of the stepped portion 9 is promoted.

The wafer processing method according to this embodiment also brings about a further advantageous effect that wear of the grinding stones 45, which takes place due to impacts from the occurrence of the off-cuts 14 and the grinding of the annular modified layers 13 in the grinding step 1004, is suppressed.

It is to be noted that the present invention should not be limited to the above-described embodiment. In other words, the above-described embodiment can be practiced with various changes or modifications to such extent as not departing from the spirit of the present invention. In the present invention, a plurality of modified layers may be formed, for example, in radial directions of the wafer 1 inside the annular stepped portion 9 such that the off-cuts 14 have smaller lengths in the peripheral direction. In the present invention, the annular modified layers 13 may be continuous or discontinuous. For example, 0.1 mm regions free of any modified layer may be interposed individually between adjacent continuous modified layers of 2 mm or smaller such that the annular modified layers 13 may be formed in the shape of a broken line.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer which has on a front surface thereof a device region with a plurality of devices formed therein and an outer peripheral surplus region surrounding the device region and which has a chamfered portion at an outer periphery thereof, the outer peripheral surplus region having no devices formed therein, the processing method comprising:
    a trimming step of cutting the wafer along an outer peripheral edge thereof while causing a cutting blade to cut from the front surface of the wafer into the chamfered portion to a depth greater than a finish thickness, so that an annular stepped portion is formed in the outer peripheral surplus region;
    after performing the trimming step, a protective member bonding step of bonding a protective member to a side of the front surface of the wafer;
    after performing the protective member bonding step, a laser processing step of applying, to the annular stepped portion, a laser beam of a wavelength that has transmissivity for the wafer to form fracture starting points in the stepped portion; and
    after performing the laser processing step, a grinding step of grinding the wafer from the back surface thereof to thin the wafer to the finish thickness, wherein during grinding, the stepped portion of the wafer is subdivided via the formation of fragments of the stepped portion.

2. The processing method according to claim 1, wherein the fracture starting points formed in the laser processing step are arranged as a plurality of annular modified layers formed near the outer peripheral edge of the wafer, and the annular modified layers are formed concentrically with each other.

3. The processing method according to claim 2, wherein the annular modified layers formed concentrically with each other have a greater length in a thickness direction of the wafer as the annular modified layers are each located closer to the outer peripheral edge.

4. The processing method according to claim 3, wherein during the grinding step, the fracture starting points in the stepped portion contribute to the subdivision of the stepped portion via the formation of fragments of the stepped portion.

5. The processing method according to claim 3, wherein the plurality of annular modified layers comprise three annular modified layers.

6. The processing method according to claim 3, wherein the annular modified layers are formed during the laser processing step, wherein upon formation of a radially outermost annular modified layer, the laser beam is set to have a focal point at a first plurality of different heights in the thickness direction, and at each height, sequentially rotating the wafer at least one turn about an axis of rotation of a chuck table holding the wafer while the laser beam is applied.

7. The processing method according to claim 6, wherein upon formation of a next radially inward annular modified layer, the laser the last beam is set to have the focal point at a second plurality of different heights in the thickness direction, the second plurality of different heights being less than the first plurality of different heights, and at each height, sequentially rotating the wafer at least one turn about the axis of rotation of the chuck table while the laser beam is applied.

8. The processing method according to claim 7, wherein the annular modified layers are formed during the laser processing step, wherein upon formation of a radially innermost annular modified layer, the laser beam is set to have a focal point at at only one height in the thickness direction, sequentially rotating the wafer at least one turn about an axis of rotation the a chuck table holding the wafer while the laser beam is applied.

9. The processing method according to claim 3, wherein the annular modified layers are formed during the laser processing step, wherein the plurality of annular modified layers are formed concentrically with each other such that the radially outermost annular modified layer approaches closer to a back surface of the wafer than radially inward annular modified layer or layers.

10. The processing method according to claim 3, wherein the plurality of annular modified layers comprise a first annular modified layer, a second annular modified layer, and a third annular modified layer, wherein the first annular modified layer is the radially outermost annular modified layer and approaches closer to a back surface of the wafer than the second and third modified layers, and wherein the second annular modified layer is radially located between the first annular modified layer and the third annular modified layer and approaches closer to a back surface of the wafer than the third modified layer.

11. The processing method according to claim 10, wherein during the grinding step, fragments of the stepped portion are sequentially from an outer peripheral side thereof which is close to the radially outermost annular modified layer, and then from an outer peripheral side thereof which is close to the second annular modified layer, and then from an outer peripheral side thereof which is close to the third annular modified layer.

12. The processing method according to claim 2, wherein the plurality of annular modified layers comprise three annular modified layers.

13. The processing method according to claim 2, wherein during the grinding step, the fracture starting points in the stepped portion contribute to the subdivision of the stepped portion via the formation of fragments of the stepped portion.

14. The processing method according to claim 2, wherein the annular modified layers comprise regions changed into a different state of density, refractive index, mechanical strength, or other physical properties from those of surroundings.

15. The processing method according to claim 2, wherein the annular modified layers comprise a fusion processed region, a cracked region, a dielectric breakdown region, a refractive index change region, a region where two or more of these regions exist mixed together.

16. The processing method according to claim 2, wherein the annular modified layers are lower in mechanical strength than the remaining portions of the stepped portion of the wafer.

17. The processing method according to claim 1, wherein during the grinding step, the fracture starting points in the stepped portion contribute to the subdivision of the stepped portion via the formation of fragments of the stepped portion.

18. The processing method according to claim 1, wherein the subdivision of the stepped portion during the grinding step reduce the size of fragments of the stepped portion that occur when the wafer is ground.

19. The processing method according to claim 1, wherein chamfered portion is formed extending from the front surface to a back surface of the wafer and is formed in a circular arc shape.

20. The processing method according to claim 1, wherein during the trimming step, a cutting machine holds the wafer on a side of a back surface thereof under suction on a holding surface of a chuck table, wherein the cutting machine rotates the cutting blade about an axis of rotation thereof by a spindle, and places a lower end of a cutting edge of the cutting blade side by side with the chamfered portion as the outer peripheral edge of the wafer along a processing feed direction of the chuck table, and also at a position lower by a distance greater than the finish thickness from the front surface of the wafer.

21. The processing method according to claim 1, wherein during the trimming step, a cutting machine holds the wafer on a side of a back surface thereof under suction on a holding surface of a chuck table, the cutting machine removes the chamfered portion on the side of the front surface by moving the cutting blade, with a lower end of a cutting edge being positioned lower than the front surface, in a horizontal direction relative to the wafer, to cause the cutting blade to cut into the wafer, and also by rotating the wafer by the chuck table about an axis of rotation of the chuck table.

22. The processing method according to claim 1, wherein during the trimming step, the stepped portion is formed in the outer peripheral edge of the wafer over an entire periphery thereof and has an annular shape.

23. The processing method according to claim 1, wherein the stepped portion extends from a position radially inward of the outer periphery of the wafer to the outer periphery of the wafer.

* * * * *